(12) United States Patent
Cui et al.

(10) Patent No.: US 11,751,421 B2
(45) Date of Patent: Sep. 5, 2023

(54) OLED DISPLAY SUBSTRATE AND METHOD FOR PREPARING THE SAME, AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Yanzhen Cui, Beijing (CN); Jin Han, Beijing (CN); Honghong Jia, Beijing (CN); Lijin Zhao, Beijing (CN); Xiaojun Gu, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 106 days.

(21) Appl. No.: 16/643,720

(22) PCT Filed: May 21, 2019

(86) PCT No.: PCT/CN2019/087786
§ 371 (c)(1),
(2) Date: Mar. 2, 2020

(87) PCT Pub. No.: WO2019/228225
PCT Pub. Date: Dec. 5, 2019

(65) Prior Publication Data
US 2021/0159451 A1   May 27, 2021

(30) Foreign Application Priority Data

May 31, 2018 (CN) .......................... 201810551648.6

(51) Int. Cl.
*H01L 51/52* (2006.01)
*H10K 50/844* (2023.01)
(Continued)

(52) U.S. Cl.
CPC ....... *H10K 50/844* (2023.02); *H10K 50/8445* (2023.02); *H10K 71/00* (2023.02); *H10K 2102/311* (2023.02)

(58) Field of Classification Search
CPC ......... H01L 2251/5338; H01L 51/5253; H01L 51/56; H01L 51/5156; H01L 51/5236;
(Continued)

(56) References Cited

U.S. PATENT DOCUMENTS

2004/0053498 A1* 3/2004 Kaji ................. H01L 21/76825
                                                              438/687
2004/0056269 A1   3/2004 Chen
(Continued)

FOREIGN PATENT DOCUMENTS

CN          1527644 A      9/2004
CN        101945965 A      1/2011
(Continued)

OTHER PUBLICATIONS

First Office Action for Chinese Application No. 201810551648.6, dated Jun. 3, 2019, 9 Pages.
(Continued)

*Primary Examiner* — John P. Dulka
(74) *Attorney, Agent, or Firm* — BROOKS KUSHMAN P.C.

(57) ABSTRACT

The present disclosure provides an OLED display substrate, a method for preparing the same, and a display device. The OLED display substrate includes an OLED device located on a base substrate and a packaging unit covering the OLED device. The packaging unit includes an inorganic material layer, an organic material layer, and a fluorine-doped diamond-like carbon layer located between the inorganic material layer and the organic material layer.

17 Claims, 4 Drawing Sheets

(51) Int. Cl.
*H10K 71/00* (2023.01)
*H10K 102/00* (2023.01)

(58) Field of Classification Search
CPC .. H10K 50/844; H10K 50/8445; H10K 71/00; H10K 2102/311
See application file for complete search history.

(56) References Cited

U.S. PATENT DOCUMENTS

| | | | |
|---|---|---|---|
| 2005/0023433 A1* | 2/2005 | Ishitaka | B29C 45/37 249/134 |
| 2005/0287688 A1* | 12/2005 | Won | C23C 16/345 438/22 |
| 2007/0020451 A1* | 1/2007 | Padiyath | C08J 7/123 428/408 |
| 2010/0272933 A1 | 10/2010 | McCormick et al. | |
| 2011/0122486 A1* | 5/2011 | Busch | C23C 16/45523 359/359 |
| 2013/0142994 A1* | 6/2013 | Wang | C03C 17/256 428/141 |
| 2014/0118947 A1* | 5/2014 | Chen | H01L 51/5259 361/707 |
| 2015/0108435 A1* | 4/2015 | Huh | H01L 51/5256 257/40 |
| 2015/0340653 A1* | 11/2015 | Yang | H10K 50/8445 257/40 |
| 2018/0212192 A1* | 7/2018 | Jin | H01L 51/5237 |
| 2018/0219178 A1 | 8/2018 | Jin et al. | |
| 2018/0226614 A1 | 8/2018 | Jin et al. | |
| 2018/0233700 A1 | 8/2018 | Li | |
| 2019/0157616 A1 | 5/2019 | Peng et al. | |
| 2019/0165298 A1* | 5/2019 | Lee | H01L 51/5206 |
| 2019/0221706 A1* | 7/2019 | Tonkikh | H01L 33/502 |

FOREIGN PATENT DOCUMENTS

| | | |
|---|---|---|
| CN | 202145468 U | 2/2012 |
| CN | 103545463 A | 1/2014 |
| CN | 106601931 A | 4/2017 |
| CN | 106654045 A | 5/2017 |
| CN | 106684259 A | 5/2017 |
| CN | 106784398 A | 5/2017 |
| CN | 108511629 A | 9/2018 |
| WO | WO2010078405 A1 * | 12/2008 ............ H01L 51/56 |

OTHER PUBLICATIONS

International Search Report and Written Opinion for Application No. PCT/CN2019/087786, dated Aug. 26, 2019, 9 Pages.

* cited by examiner

OLED DISPLAY SUBSTRATE AND METHOD FOR PREPARING THE SAME, AND DISPLAY DEVICE

CROSS-REFERENCE TO RELATED APPLICATIONS

This application is the U.S. national phase of PCT Application No. PCT/CN2019/087786 filed on May 21, 2019, which claims priority to Chinese Patent Application No. 201810551648.6 filed on May 31, 2018, which are incorporated herein by reference in their entireties.

TECHNICAL FIELD

The present disclosure relates to the field of display technology, in particular, to an OLED display substrate and a method for preparing the same, and a display device including the OLED display substrate.

BACKGROUND

A flexible organic light emitting diode (OLED) is an important research direction of OLED devices. The light emitting materials in the OLED are generally high molecular polymers or organic small molecule compounds, and the cathode materials are generally metal materials with lower work functions, such as magnesium and aluminum. These light emitting materials and cathode materials are very sensitive to water vapor and oxygen. If water and oxygen molecules continue to invade the inside of the OLED device, the organic material layer (including the hole injection layer, the hole transport layer, the light emitting layer, the electron transport layer, and the electron injection layer) will be degraded, and the cathode will be oxidized, thereby reducing the service life of the OLED device. Therefore, it is necessary to use appropriate packaging technology to prevent water molecules and oxygen molecules from invading the inside of the OLED device.

SUMMARY

In one aspect, the present discloses provides an organic light emitting diode (OLED) display substrate, including an OLED device located on a base substrate and a packaging unit covering the OLED device, in which the packaging unit includes an inorganic material layer, an organic material layer, and a fluorine-doped diamond-like carbon layer located between the inorganic material layer and the organic material layer.

Optionally, the OLED display substrate includes a plurality of packaging units sequentially covering the OLED device, and each of the plurality of packaging units includes an inorganic material layer, an organic material layer and a fluorine-doped diamond-like carbon layer located between the inorganic material layer and the organic material layer.

Optionally, a content of fluorine element in the fluorine-doped diamond-like carbon layer is less than 10 wt %.

Optionally, the fluorine-doped diamond-like carbon layer has a thickness of 10 nm to 100 nm.

Optionally, the packaging unit farther includes a definition structure, in which the organic material layer and the fluorine-doped diamond-like carbon layer of the packaging unit are located in a region defined by the definition structure.

Optionally, each of the plurality of packaging units farther includes a definition structure, in which the organic material layer and the fluorine-doped diamond-like carbon layer of each of the plurality of packaging units are located in a region defined by the definition structure.

Optionally, the definition structure is made of one or more materials selected from diamond-like carbon, graphene, silver, aluminum, aluminum nitride, and copper.

Optionally, the definition structure of the packaging unit proximate to the OLED device is located in a region defined by the definition structure of the packaging unit away from the OLED device.

In another aspect, the present disclosure also provides a display device including the OLED display substrate as described above.

In yet another aspect, the present disclosure also provides a method for preparing an OLED display substrate, including forming an OLED device and a packaging unit covering the OLED device on a base substrate, in which the step of forming the packaging unit includes sequentially forming an inorganic material layer, and forming a fluorine-doped diamond-like carbon layer and an organic material layer.

Optionally, the step of forming the packaging unit further includes forming a definition structure.

Optionally, the step of forming the fluorine-doped diamond-like carbon layer and the organic material layer includes forming the fluorine-doped diamond-like carbon layer and the organic material layer in a region defined by the definition structure.

Optionally, the step of forming the packaging unit includes: forming an inorganic material layer; forming a photosensitive material layer on the inorganic material layer; exposing and developing the photosensitive material layer to form a photosensitive material reserved region and a photosensitive material unreserved region, in which the photosensitive material unreserved region corresponds to the region where the definition structure is formed; depositing a definition structure material layer, in which a thickness of the definition structure material layer is less than a thickness of the photosensitive material layer: stripping the photosensitive material in the photosensitive material reserved region, in which a definition structure material layer located in the photosensitive material unreserved region is reserved to form the definition structure; forming the fluorine-doped diamond-like carbon layer in a region defined by the definition structure on the inorganic material layer; and forming the organic material layer in a region defined by the definition structure on the fluorine-doped diamond-like carbon layer.

Optionally, the method further includes repeating the above steps to sequentially form a plurality of packaging units covering the OLED device.

Optionally, the method further includes forming an inorganic material layer covering the packaging unit on an outermost side.

DETAILED DESCRIPTION

Figure 1:
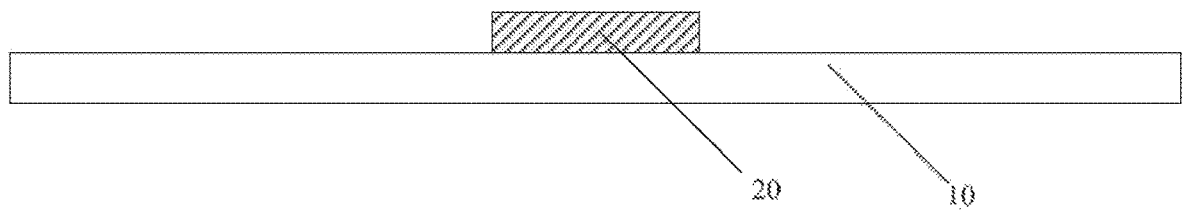
FIGS. 1 to 10 are schematic views showing the structure of an OLED display substrate prepared in each step of a method for preparing an OLED display substrate according to an embodiment of the present disclosure.

In order to make the technical problems to be solved, the technical solutions, and the advantages of the examples of the present disclosure, the present disclosure will be described hereinafter in conjunction with the drawings and specific examples.

The present disclosure provides an OLED display substrate, a method for preparing the same, and a display device, which are capable of enhancing the ability to block external water and oxygen of the OLED display substrate and to improve the service life of the OLED display substrate, and can ensure a sufficient light transmittance of the OLED display substrate at the same time.

According to an embodiment of the present disclosure, there is provided an OLED display substrate, including: an OLED device located on a base substrate and a packaging unit covering the OLED device, in which the packaging unit includes an inorganic material layer, an organic material layer, and a fluorine-doped diamond-like carbon layer located between the inorganic material layer and the organic material layer.

In the OLED display substrate according to the embodiment of the present disclosure, the packaging unit covering the OLED device includes a fluorine-doped diamond-like carbon layer. The fluorine-doped diamond-like carbon layer can fill the surface defects of the inorganic material layer, and enhance the ability of the packaging unit to block external water and oxygen and extend the service life of the OLED device. In addition, the stress of the fluorine-doped diamond-like carbon layer is reduced, and bending deformation is more easily achieved, thereby meeting the requirements of flexible display. In addition, the light transmittance of the fluorine-doped diamond-like carbon layer can be further maintained at 95% or more by controlling the content of fluorine in the fluorine-doped diamond-like carbon layer and the thickness of the fluorine-doped diamond-like carbon layer. The light transmittance can hilly meet the requirements of the OLED device for the packaging material, thereby ensuring the light transmittance of the OLED display substrate.

Diamond-like carbon (DLC) has excellent abrasion resistance, thermal stability, chemical stability and corrosion resistance, and has good hydrophobicity and light transmission at the same time. Therefore, as compared with general organic materials and ceramic materials, DLC has certain advantages and prospects in the packaging process of the OLED. However, since the density of the pure DLC film is relatively large, the light transmittance is not high, and the stress of the DLC thin film is very large, and it is easy to crack during bending deformation. The inventors of the present disclosure have discovered through research that the internal stress of the DLC; thin film is reduced by partially or completely replacing hydrogen atoms in the DLC structure with fluorine atoms, thereby improving its structural stability and its strength of bonding with the substrate. In another aspect, fluorine-doped diamond-like carbon (F-DLC) further improves hydrophobicity and optical transmission while retaining the excellent abrasion resistance, thermal stability, chemical stability, and corrosion resistance of DLC, and thus can be applied in the packaging process of the OLED display substrate.

As compared with the traditional DLC thin film, the fluorine-doped diamond-like carbon (F-DLC) layer has an internal stress greatly reduced from 700 MPa to 250 MPa. This makes it easier for the fluorine-doped diamond like carbon layer to achieve bending deformation, thereby meeting the requirements of the flexible display. In addition, the fluorine-doped diamond-like carbon layer has been proven to improve the hydrophobic properties of DLC. The addition of fluorine element can passivate the adsorption of water vapor and oxygen by the fluorine-doped diamond-like carbon layer, and thus improving the ability of the OLED packaging structure to block water and oxygen, thereby extending the service life of the OLED device. The light transmittance of the fluorine-doped diamond-like carbon layer is closely related to the content of fluorine, the thickness of the fluorine-doped diamond-like carbon layer, and the preparation process. As the fluorine content increases, the transmittance of the fluorine-doped diamond-like carbon layer will decrease. As the thickness of the fluorine-doped diamond-like carbon layer increases, the transmittance of the fluorine-doped diamond-like carbon layer will increase first and decrease later in addition, different conditions set in the preparation process have different effects on the transmittance of the fluorine-doped diamond-like carbon layer. Theoretically, when the fluorine content is less than 10 wt % and the thickness is between 10 nm and 100 nm, the light transmittance of the fluorine-doped diamond like carbon layer can be maintained at 95% or more by adjusting the conditions of the preparation process no transmittance can hilly meet the requirements of the device for the packaging material, thereby ensuring sufficient light transmittance of the OLED display substrate. Therefore, in the fluorine-doped diamond-like carbon layer of this embodiment, the content of fluorine element optionally less than 10 wt %, and the thickness of the fluorine-doped diamond-like carbon layer is optionally 10 nm to 100 nm.

Optionally, the OLED display substrate includes a plurality of packaging units sequentially covering the OLED device, and each of the plurality of packaging units includes an inorganic material layer, an organic material layer and a fluorine-doped diamond-like carbon layer located between the inorganic material layer and the organic material layer.

Optionally, the packaging unit further includes a definition structure, in which the organic material layer and the fluorine-doped diamond-like carbon layer of the packaging unit are located in a region defined by the definition structure.

Optionally, the OLED display substrate includes a plurality of packaging units sequentially covering the OLED device, and each of the plurality of packaging units farther includes a definition structure, in which the organic material layer and the fluorine-doped diamond-like carbon layer of each of the plurality of packaging units are located in a region defined by the definition structure. Optionally, when the organic material layer is prepared, a rheological organic material is generally printed in a region defined b a definition structure to form the organic material layer. The rheological organic material can be prevented fun overflowing by the definition structure.

Optionally, the definition structure is made of one or more materials selected from diamond-like carbon, graphene, silver, aluminum, aluminum nitride, and copper. These materials have a relatively good denseness, and are capable of effectively blocking the rheological organic material.

Optionally, the OLED display substrate includes a plurality of packaging units sequentially covering the OLED device, and the definition structure of the packaging unit proximate to the OLED device is located in a region defined by the definition structure of the packaging unit away from the OLED device.

According to another embodiment of die present disclosure, there is also provided a display device including the OLED display substrate as described above. The display device may include any product or component having a display function, such as a liquid crystal television, a liquid crystal display, a digital photo frame, a mobile phone, and a tablet computer. The display device further includes a flexible circuit board, a printed circuit board, and a backplane.

According to still another embodiment of the present disclosure, there is also provided a method for preparing an OLED display substrate, including: forming an OLED device and a packaging unit covering the OLED device on a base substrate, in which the step of forming the packaging unit includes sequentially forming an inorganic material layer, a fluorine-doped diamond-like carbon layer, and an organic material layer.

As similar to the above, in the OLED display substrate according to the embodiment of the present disclosure, the packaging unit covering the OLED device includes a fluorine-doped diamond-like carbon layer. The fluorine-doped diamond-like carbon layer can till the surface defects of the inorganic material layer, and enhance the ability of the packaging unit to block external water and oxygen and extend the service life of the OLED device. In addition, the stress of the fluorine-doped diamond-like carbon layer is reduced, and bending deformation is more easily achieved, thereby meeting the requirements of flexible display. In addition, the light transmittance of the fluorine-doped diamond-like carbon layer can be further maintained at 95% or more by controlling the content of fluorine in the fluorine-doped diamond-like carbon layer and the thickness of the fluorine-doped diamond-like carbon layer. The light transmittance can fully meet the requirements of the OLED device for the packaging material, thereby ensuring the light transmittance of the OLED display substrate.

Optionally, in the fluorine-doped diamond-like carbon layer of this embodiment, the content of fluorine element is preferably less than 10 wt %, and the fluorine-doped diamond-like carbon layer preferably has a thickness of 10 nm to 100 nm.

Optionally, the forming the packaging unit further includes forming a definition structure.

Optionally, the step of forming the fluorine-doped diamond-like carbon layer and the organic material layer includes forming the fluorine-doped diamond-like carbon layer and the organic material layer in a region defined by the definition structure. Optionally, when the organic material layer is prepared, a rheological organic material is printed in a region defined by a definition structure to form the organic material layer. The rheological organic material can be prevented from overflowing by the definition structure.

In a specific embodiment according to the present disclosure, the step of forming the packaging unit includes; forming an inorganic material layer; forming a photosensitive material layer on the inorganic material layer; exposing and developing the photosensitive material layer to form a photosensitive material reserved region and a photosensitive material unreserved region, in which the photosensitive material unreserved region corresponds to a region where the definition structure is formed; depositing a definition structure material layer, in which a thickness of the definition structure material layer is less than a thickness of the photosensitive material layer; stripping the photosensitive material in the photosensitive material reserved region, in which a definition structure material layer located in the photosensitive material unreserved region is reserved to form the definition structure; forming the fluorine-doped diamond-like carbon layer in a region defined by the definition structure on the inorganic material layer; and forming the organic material layer in a region defined by the definition structure on the fluorine-doped diamond-like carbon layer.

Hereinafter, taking an OLED display substrate including two packaging units as an example, a method for preparing an OLED display substrate of the present disclosure will be further described in conjunction with the drawings. As shown in FIGS. 1 to 10, the method for preparing the OLED display substrate of this embodiment specifically includes the following steps.

In step 1, as shown in FIG. 1, a base substrate 10 is provided, and an OLED device 20 is formed on the base substrate 10. The base substrate 10 may be a rigid substrate, e.g., a quartz substrate or a glass substrate: The base substrate 10 may also be a flexible substrate, e.g., a polyimide substrate. The OLED device 20 includes an anode, an organic light emitting layer, and a cathode.

Figure 2:
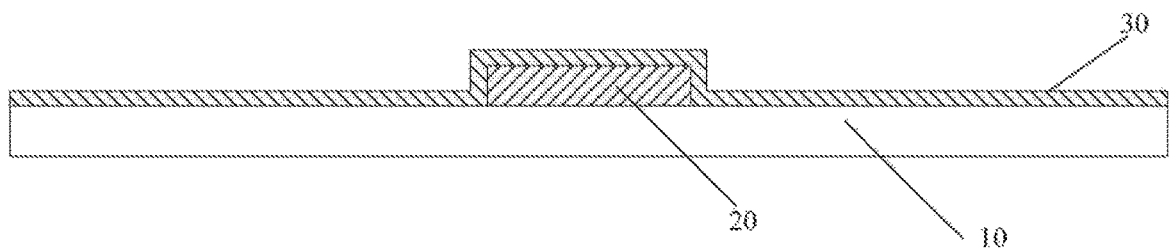

In step 2, as shown in FIG. 2, a first inorganic material layer 30 is formed on the OLED device 20. Specifically, the first inorganic material layer 30 may be made of one or more selected from aluminum oxide ($Al_2O_3$), silicon oxide ($SiO_x$), silicon nitride ($SiN_x$) and titanium dioxide ($TiO_2$), The first inorganic material layer 30 can be formed by using at least one selected from plasma enhanced chemical vapor deposition, atomic layer deposition, pulsed laser deposition, or magnetron sputtering process. The first inorganic material layer 30 has a thickness of 0.1 μm to 1 μm.

Figure 3:
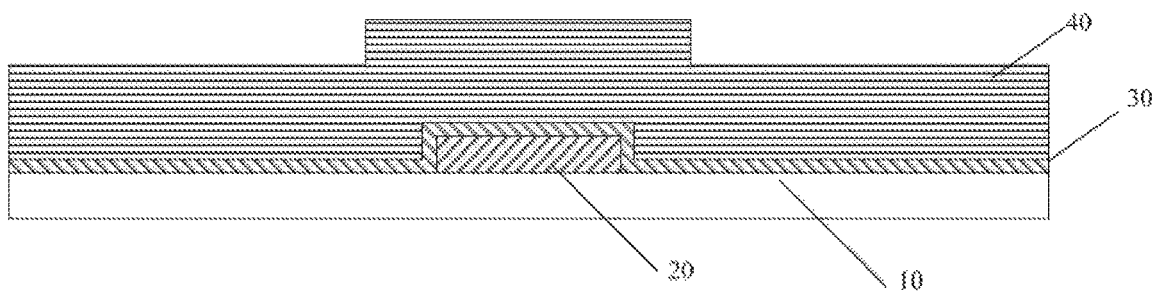

In step 3, as shown in FIG. 3, a photoresist layer 40 is formed on the first inorganic material layer 30. The photoresist layer 40 may be a negative photoresist. The photoresist layer 40 may be formed by spin coating, screen printing, or inkjet printing. The photoresist layer 40 has a thickness 0.5 μm to 3 μm.

Figure 4:
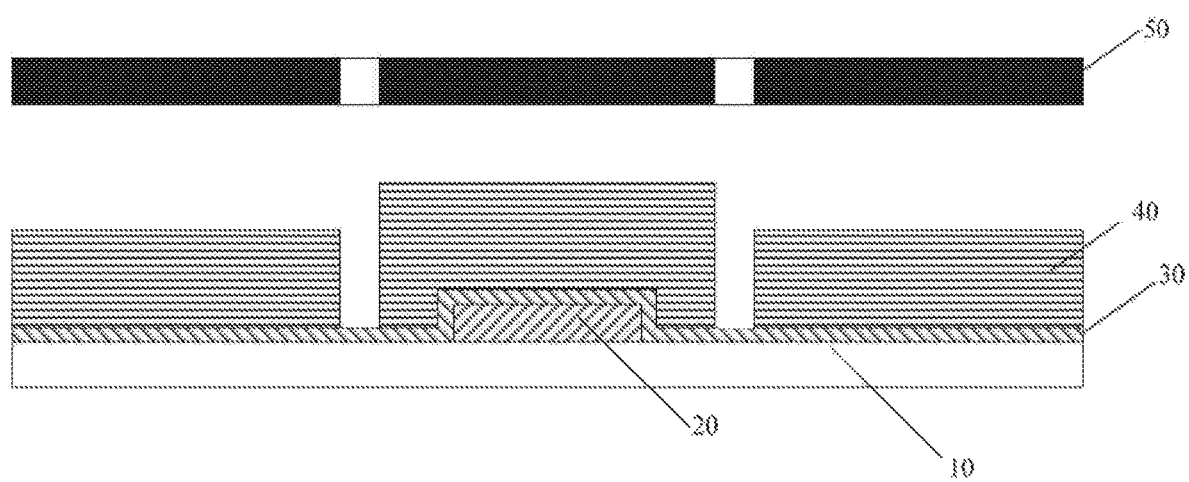

In step 4, as shown in FIG. 4, the photoresist layer 40 is exposed and developed by using a mask 50. The developed region is located outside the OLED device 20, and a peripheral definition region 31 is formed on the first inorganic material layer 30. The risk 50 includes a light transmitting region and an opaque region. The light transmitting region corresponds to a portion of the photoresist layer 40 to be removed, and the opaque region corresponds to a portion of the photoresist layer 40 to be reserved.

Figure 5:
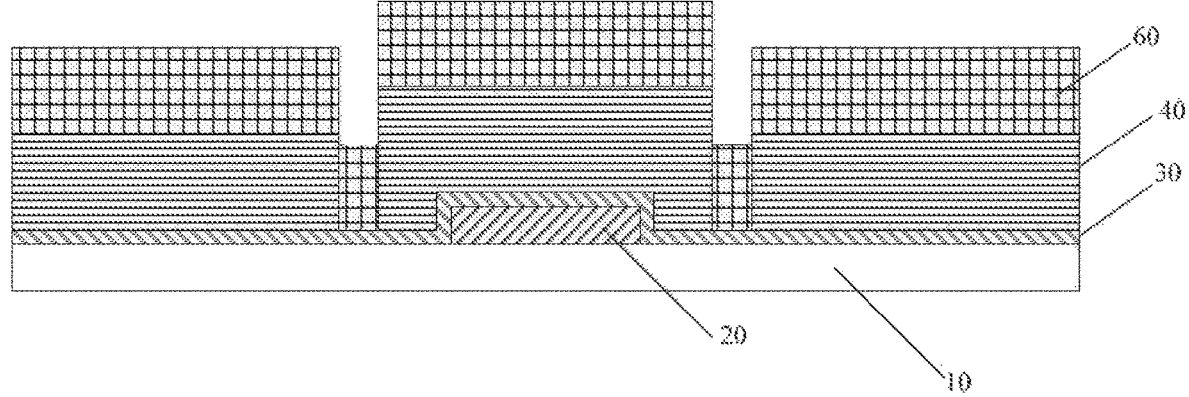

In step 5, as shown in FIG. 5, a dense material layer 60 is deposited on the photoresist layer 40 and the peripheral definition region 31. The thickness of the dense material layer 60 needs to be less than the thickness of the photoresist layer 40, so that the dense material layer 60 can be relatively easily stripped from the base substrate 10 in the subsequent steps. Specifically, the dense material layer 60 is made of one or more materials selected from diamond-like carbon, graphene, silver, aluminum, aluminum nitride, and copper. The dense material layer 60 can be formed by using plasma enhanced chemical vapor deposition, atomic layer deposition, pulsed laser deposition, or magnetron sputtering process. The dense material layer 60 has a thickness of 0.5 μm to 3 μm.

Figure 6:
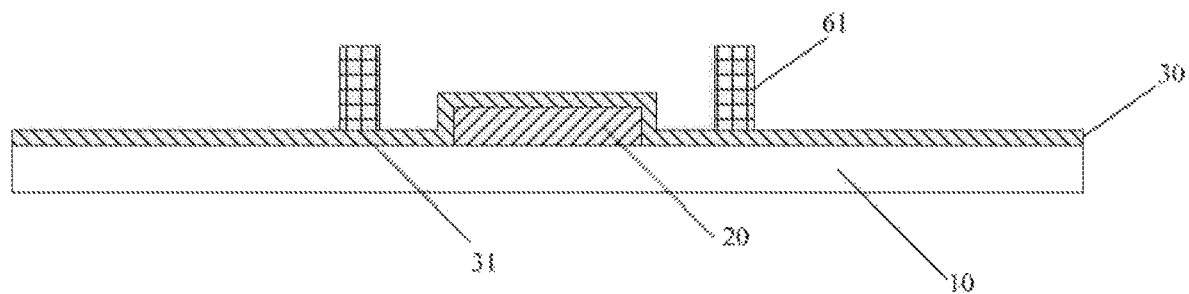

In step 6, as shown in FIG. 6, the base substrate 10 obtained after step 5 is placed in a photoresist shipping solution, the dense material layer 60 located on the photoresist layer 40 is stripped together with the photoresist layer 40, and the dense material layer 60 located on the first inorganic material layer 30 is reserved, thereby forming a first peripheral definition layer 61 (i.e., the above-mentioned definition structure). The first peripheral definition layer 61 defines a peripheral definition region 31.

Figure 7:
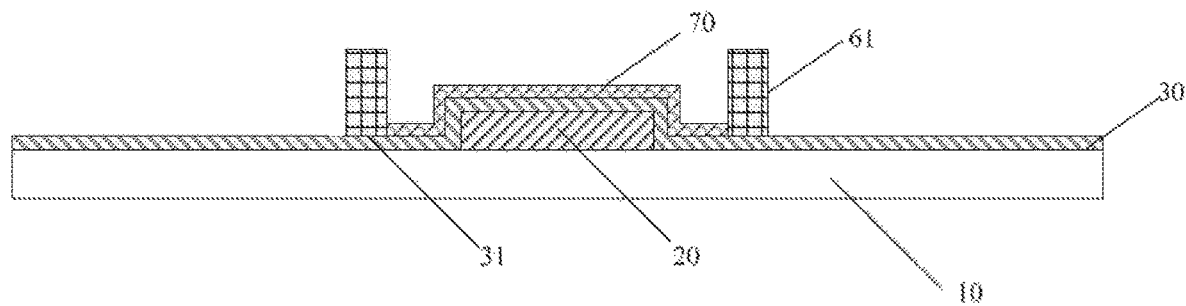

In step 7, as shown in FIG. 7, a first fluorine-doped diamond-like carbon layer 70 is formed on the first inorganic material layer 30 inside the first peripheral definition layer 61. Specifically, the first fluorine-doped diamond-like carbon layer 70 is made of a diamond-like carbon doped with fluorine element. The fluorine element content is less than 10 wt %, and the light transmittance of the first fluorine-doped diamond-like carbon layer 70 is greater than 95%. The first fluorine-doped diamond-like carbon layer 70 can be formed by plasma enhanced chemical vapor deposition, pulsed laser deposition, or magnetron sputtering process. The first fluorine-doped diamond-like carbon layer 70 has a thickness of 10 nm to 100 nm.

Figure 8:
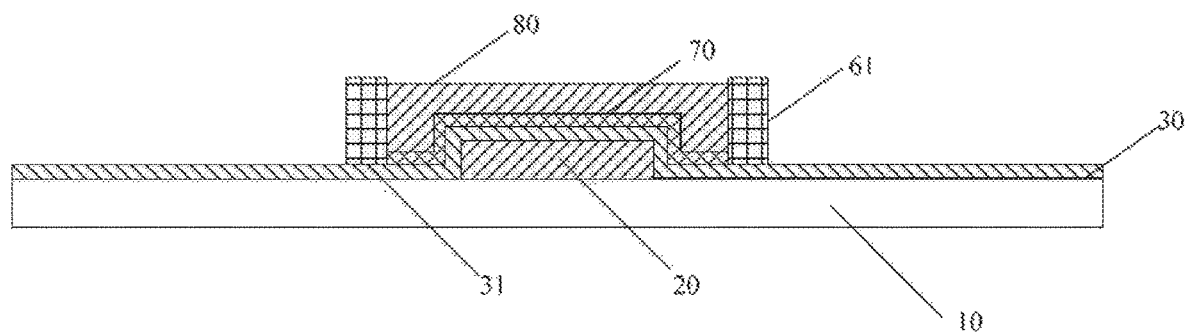

In step 8, as shown in FIG. 8, a first organic material layer 80 is formed in an inner region of the first peripheral definition layer 61 and an upper region of the first fluorine-doped diamond-like carbon layer 70. Specifically, the first organic material layer 80 is made of one or more materials selected from polyacrylate, silicone and polystyrene. The first organic material layer 80 may be formed by spin coating or inkjet printing process. The thickness of the first organic material layer 80 is in a range of 0.5 nm to 3 μm.

After the above steps 1 to 8, an OLED display substrate having one packaging unit can be formed. The packaging unit includes a first peripheral definition layer 61, a first inorganic material layer 30, a first fluorine-doped diamond-like carbon layer 70, and a first organic material layer 80.

Figure 9:
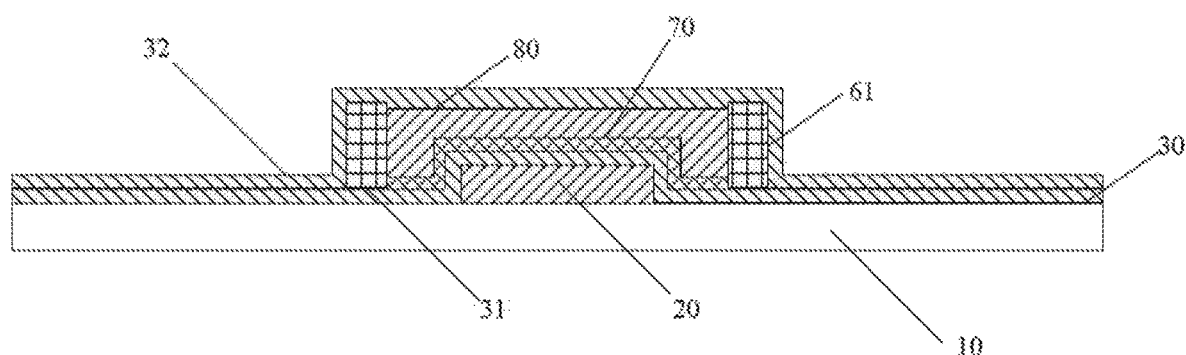

In step 9, as shown in FIG. 9, a second inorganic material layer 32 is formed on the first inorganic material layer 30, the first peripheral definition layer 61 and the first organic material layer 80. Since the first organic material layer 80 has a relatively weak ability to block water and oxygen, when the OLED display substrate includes only one packaging unit, a second inorganic material layer 32 is required to be formed on the first organic material layer 80. Specifically, the second inorganic material layer 32 may be made of one or more materials selected from aluminum oxide ($Al_2O_4$), silicon oxide ($SiO_x$), silicon nitride ($SiN_x$) and titanium dioxide ($TiO_2$). The second inorganic material layer 32 can be formed by using at least one selected from plasma enhanced chemical vapor deposition, atomic layer deposition, pulsed laser deposition, or magnetron sputtering process. The thickness of the second inorganic material layer 32 is in range of 0.1 μm to 1 μm.

In addition, when the OLED display substrate includes a plurality of packaging units, the second inorganic material layer 32 may also act as an inorganic material layer of the next packaging unit. An OLED display substrate having a plurality of packaging units is prepared by repeating the above steps.

Figure 10:
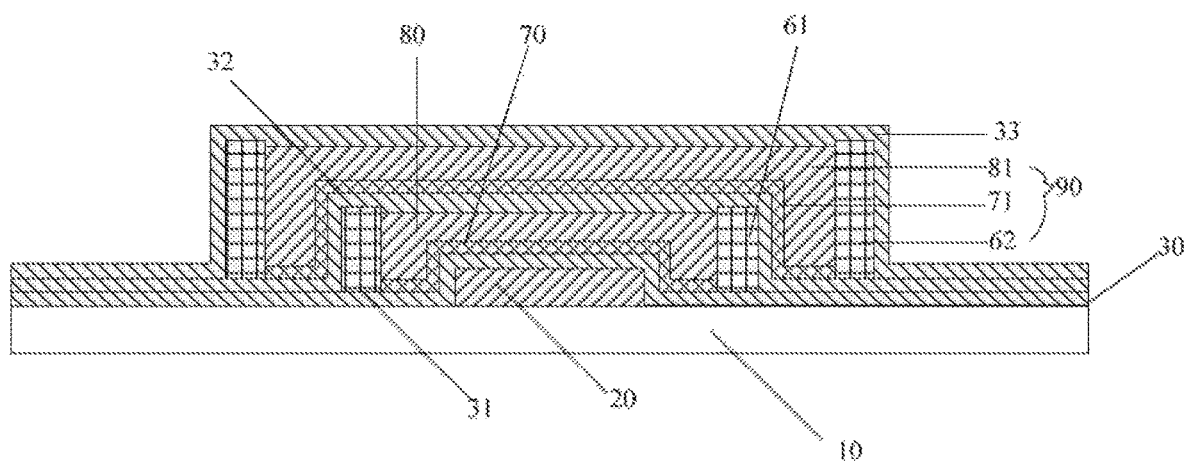

In step 10, as shown in FIG. 10, when the OLED display substrate includes two packaging units, the second peripheral definition layer 62, the second fluorine-doped diamond-like diamond layer 71 and second organic material layer 81 may be sequentially formed on the second inorganic material layer 32 by repeating the above steps. Similarly, since the second organic material layer 81 has a relatively weak ability to block water and oxygen, when the OLED display substrate includes only two packaging units, a third inorganic material layer 3 is required to be formed on the second organic material layer 81. The second inorganic material layer 32, the second peripheral definition layer 52, the second fluorine-doped diamond-like carbon layer 71, and the second organic material layer 81 constitute a second packaging unit 90.

When the OLED display substrate includes a plurality of packaging units, the remaining packaging units may be formed in a similar manner to the above steps. In addition, when the OLED display substrate includes a plurality of packaging units, the third inorganic material layer 33 may also act as an inorganic material layer of the next packaging unit.

In the method embodiments of the present disclosure, the serial numbers of the steps cannot be used to define the sequence of the steps. As for one skilled in the art, the changes in the order of steps without making creative work also fall within the scope of the present disclosure.

Unless otherwise defined, technical terms or scientific terms used herein have the normal meaning commonly understood by one skilled in the art in the field of the present disclosure. The words "first", "second", and the like used in the present disclosure does not denote any order, quantity, or importance, but rather merely serves to distinguish different components. The "including", "comprising", and the like used in the present disclosure means that the element or item appeared in front of the word encompasses the element or item and their equivalents listed after the word, and does exclude other elements or items. "On", "under", "left", "right" and the like are only used to represent relative positional relationships, and when the absolute position of the described object is changed, the relative positional relationship may also be changed, accordingly. It will be understood that when an element, such as a layer, film, region, or substrate, is referred to as being "on" or "under" another element, the element may be directly "on" or "under" another element, or there may be an intermediate element.

The above embodiments are the optional embodiments of the present disclosure. It should be noted that one skilled in the art would make several improvements and substitutions without departing from the principles of the present disclosure, these improvements and modifications should also be regarded as the protection scope of the present disclosure.

What is claimed is:

1. An Organic Light-Emitting Diode (OLED) display substrate, comprising an OLED device located on a base substrate and a packaging unit covering the OLED device, wherein the packaging unit comprises an inorganic material layer, an organic material layer, and a fluorine-doped diamond-like carbon layer which is located between the inorganic material layer and the organic material layer and directly in physical contact with both the inorganic material layer and the organic material layer, wherein the packaging unit further comprises a definition structure locating on and being directly in physical contact with a surface of the inorganic material layer parallel to an extending direction of the base substrate, and extending around the periphery of the organic material layer and the fluorine-doped diamond-like carbon layer, wherein the organic material layer and the fluorine-doped diamond-like carbon layer of the packaging unit are located in a region defined by the definition structure, the fluorine-doped diamond-like carbon layer is located throughout the region defined by the definition structure on the inorganic material layer, and wherein the definition structure is directly in physical contact with surfaces of both the fluorine-doped diamond-like carbon layer and the organic material layer extending in a direction from the base substrate to the OLED device.

2. The OLED display substrate of claim 1, wherein the OLED display substrate comprises a plurality of packaging units sequentially covering the OLED device, and each of the plurality of packaging units comprises the inorganic material layer, the organic material layer and the fluorine-doped diamond-like carbon layer which is located between the inorganic material layer and the organic material layer and directly in physical contact with both the inorganic material layer and the organic material layer of said packaging unit.

3. The OLED display substrate of claim 2, wherein each of the plurality of packaging units further comprises a definition structure, and the organic material layer and the fluorine-doped diamond-like carbon layer of each of the plurality of packaging units are located in a region defined by the definition structure.

4. The OLED display substrate of claim 3, wherein the definition structure is made of one or more materials selected from the group consisting of diamond-like carbon, graphene, silver, aluminum, aluminum nitride, and copper.

5. The OLED display substrate of claim 3, wherein the definition structure of the packaging unit proximate to the OLED device is located in a region defined by the definition structure of the packaging unit away from the OLED device.

6. The OLED display substrate of claim 1, wherein a content of fluorine element in the fluorine-doped diamond-like carbon layer is less than 10 wt %.

7. The OLED display substrate of claim 1, wherein the fluorine-doped diamond-like carbon layer has a thickness of 10 nm to 100 nm.

8. The OLED display substrate of claim 1, wherein the definition structure is made of one or more materials selected from the group consisting of diamond-like carbon, graphene, silver, aluminum, aluminum nitride, and copper.

9. A display device, comprising the OLED display substrate of claim 1.

10. The display device of claim 9, wherein a content of fluorine element in the fluorine-doped diamond-like carbon layer is less than 10 wt %.

11. The display device of claim 9, wherein the fluorine-doped diamond-like carbon layer has a thickness of 10 nm to 100 nm.

12. The display device of claim 9, wherein the definition structure is made of one or more materials selected from the group consisting of diamond-like carbon, graphene, silver, aluminum, aluminum nitride, and copper.

13. A method for preparing an OLED display substrate, comprising forming an OLED device and a packaging unit covering the OLED device on a base substrate,
wherein the step of forming the packaging unit comprises sequentially forming an inorganic material layer, a fluorine-doped diamond-like carbon layer, an organic material layer and a definition structure,
wherein the fluorine-doped diamond-like carbon layer is directly in physical contact with both the inorganic material layer and the organic material layer,
wherein the definition structure is located on and directly in physical contact with a surface of the inorganic material layer parallel to an extending direction of the base substrate, and extends around the periphery of the organic material layer and the fluorine-doped diamond-like carbon layer,
wherein the organic material layer and the fluorine-doped diamond-like carbon layer of the packaging unit are located in a region defined by the definition structure, the fluorine-doped diamond-like carbon layer is located throughout the region defined by the definition structure on the inorganic material layer, and
wherein the definition structure is directly in physical contact with surfaces of both the fluorine-doped diamond-like carbon layer and the organic material layer extending in a direction from the base substrate to the OLED device.

14. The method of claim 13, wherein the step of forming the fluorine-doped diamond-like carbon layer and the organic material layer comprises forming the fluorine-doped diamond-like carbon layer and the organic material layer in a region defined by the definition structure.

15. The method of claim 13, wherein the step of forming the packaging unit comprises:
forming an inorganic material layer;
forming a photosensitive material layer on the inorganic material layer;
exposing and developing the photosensitive material layer to form a photosensitive material reserved region and a photosensitive material unreserved region, wherein the photosensitive material unreserved region corresponds to a region where the definition structure is formed;
depositing a definition structure material layer, wherein a thickness of the definition structure material layer is less than a thickness of the photosensitive material layer;
stripping the photosensitive material in the photosensitive material reserved region, wherein a definition structure material layer located in the photosensitive material unreserved region is reserved to form the definition structure;
forming the fluorine-doped diamond-like carbon layer in a region defined by the definition structure on the inorganic material layer; and
forming the organic material layer in a region defined by the definition structure on the fluorine-doped diamond-like carbon layer.

16. The method of claim 13, wherein the method further comprises repeating the above steps to sequentially form a plurality of packaging units covering the OLED device.

17. The method of claim 13, wherein the method further comprises forming an inorganic material layer covering the packaging unit on an outermost side.

* * * * *